(12) United States Patent
Masumoto et al.

(10) Patent No.: US 7,621,969 B2
(45) Date of Patent: Nov. 24, 2009

(54) MOUNTING SYSTEM

(75) Inventors: Mutsumi Masumoto, Oita (JP); Katsumi Terada, Shiga (JP)

(73) Assignee: Toray Engineering Co., Ltd., Tokyo (JP)

( * ) Notice: Subject to any disclaimer, the term of this patent is extended or adjusted under 35 U.S.C. 154(b) by 229 days.

(21) Appl. No.: 11/887,212

(22) PCT Filed: Mar. 13, 2006

(86) PCT No.: PCT/JP2006/304890

§ 371 (c)(1),
(2), (4) Date: Sep. 26, 2007

(87) PCT Pub. No.: WO2006/112217

PCT Pub. Date: Oct. 26, 2006

(65) Prior Publication Data

US 2009/0011538 A1 Jan. 8, 2009

(30) Foreign Application Priority Data

Mar. 31, 2005 (JP) .............................. 2005-102746

(51) Int. Cl.
*H01L 21/00* (2006.01)
(52) U.S. Cl. ..................................... 29/25.01; 438/106
(58) Field of Classification Search ......... 438/106–127; 29/25.01
See application file for complete search history.

(56) References Cited

U.S. PATENT DOCUMENTS 6,197,612 B1  3/2001  Watanabe 6,230,719 B1 * 5/2001 Wensel ........................ 134/1.1
2003/0150108 A1  8/2003  Higashi et al.

FOREIGN PATENT DOCUMENTS

| JP | 5-315400 | A | 11/1993 |
| JP | 11-126796 | A | 5/1999 |
| JP | 2002-350871 | A | 12/2002 |
| JP | 2003-017534 | B | 1/2003 |
| JP | 2004-303323 | A | 10/2004 |

\* cited by examiner

*Primary Examiner*—Richard A. Booth
(74) *Attorney, Agent, or Firm*—Smith Patent Office

(57) ABSTRACT

A mounting system is provided with a substrate loader section, a chip mounting section, and a substrate unloader section for sequentially taking out substrates whereupon chips are mounted. The mounting system is characterized in that the substrate loader section is provided with an oven capable of heat insulating a substrate together with a substrate magazine capable of containing a plurality of substrates, a stage heater for heating/heat insulating a substrate is provided, respectively, at a substrate conveying portion from a substrate waiting stage for the chip mounting section to the chip mounting section, at the chip mounting section, and at a substrate conveying portion from the chip mounting section to the substrate unloader section, and the substrate unloader section is provided with an oven capable of heat insulating a substrate together with a substrate magazine capable of containing a plurality of substrates whereupon chips are mounted. The substrate can be sustained at a desirable temperature over the substantially entire mounting process having a series of steps, and in particular, occurrence of problems ascribed to moisture absorption can be suppressed or prevented.

8 Claims, 2 Drawing Sheets

MOUNTING SYSTEM

TECHNICAL FIELD OF THE INVENTION

The present invention relates to a mounting system for mounting a chip onto a substrate, and specifically, to a mounting system capable of carrying out a high-accuracy mounting under a stable temperature condition.

BACKGROUND ART OF THE INVENTION

In a process for mounting a chip onto a substrate, for example, in a process for mounting a semiconductor chip onto a resin-group multi-layer circuit board, it is desired to pay attention to problems accompanied with temperature variation of the substrate, particularly, problems ascribed to moisture absorption accompanied with the temperature variation. A substrate to be mounted with a chip is frequently served usually to a process wherein it is once baked in order to evaporate moisture before mounting, it is supplied to a substrate loader at a style of a substrate magazine containing a plurality of substrates, and it is supplied from the section of the substrate loader to a chip mounting section. In the step for sequentially loading the substrates toward the chip mounting section, however, because a substrate loaded from the substrate magazine at a latter stage is likely to absorb moisture in the atmosphere as the time passes, when an underfill agent (a resin) is cured after an underfill process (a process for providing a resin between the substrate and the chip), a problem may occur in that a delamination of mounting interface or voids occur by a volume expansion or evaporation of the moisture absorbed into the substrate. Further, because a change in volume occurs by the moisture absorption, the substrate is likely to be bowed. If the substrate bows, there occurs a problem that a proper bonding between a bump and an electrode may not be performed between the chip and the substrate.

In the mounting of a chip onto a substrate, in order to achieve a more reliable mounting, a technology is known wherein heating or heat insulating is carried out at an individual step in a mounting process. For example, known are a technology for accelerating degassing by heating an adhesive and a substrate, thereby preventing the residue of voids and uncharged spaces (for example, Patent document 1), and a technology for reserving the atmosphere temperature of a holding means for an element or a substrate at a predetermined temperature, thereby suppressing the bowing and the like of the element or the substrate (for example, Patent document 2).

In these conventional technologies, however, even if a heating or a heat insulating can be achieved at a certain step in the mounting process having a series of steps, since it is difficult to sustain a substrate at a desirable temperature over the entire mounting process, it is difficult to completely solve the aforementioned problems ascribed to moisture absorption.

Patent document 1: JP-A-2004-303323
Patent document 2: JP-A-2002-350871

DISCLOSURE OF THE INVENTION

Problems to be Solved by the Invention

Accordingly, an object of the present invention is to provide a mounting system in which a substrate can be sustained at a desirable temperature over the substantially entire mounting process having a series of steps, and in particular, occurrence of problems ascribed to moisture absorption can be suppressed or prevented.

Means for Solving the Problems

To achieve the above object, a mounting system according to the present invention has a substrate loader section for sequentially supplying substrates to a chip mounting section, the chip mounting section for mounting chips onto substrates supplied, and a substrate unloader section for sequentially taking out substrates whereupon chips are mounted, and is characterized in that the substrate loader section is provided with a first oven capable of heat insulating a substrate together with a substrate magazine capable of containing a plurality of substrates, a stage heater for heating/heat insulating a substrate is provided, respectively, at a substrate conveying portion from a substrate waiting stage for the chip mounting section to the chip mounting section, at the chip mounting section, and at a substrate conveying portion from the chip mounting section to the substrate unloader section, and the substrate unloader section is provided with a second oven capable of heat insulating a substrate together with a substrate magazine capable of containing a plurality of substrates whereupon chips are mounted.

Namely, the mounting system is constructed so that, in a process for mounting a chip onto a substrate, in particular, in a process for mounting a semiconductor chip onto a resin-group multi-layer circuit board which is liable to absorb moisture, during a series of steps from the loading of the substrate to the unloading of the product mounted with the chip, the substrate is conveyed at a condition where the temperature of the substrate is sustained at a desirable constant temperature.

In this mounting system according to the present invention, in a case where a resin providing section (an underfill section) for providing a resin (an underfill agent) between the substrate and the chip is provided between the chip mounting section and the substrate unloader section, or in a case where the resin providing section is provided at the chip mounting section, it is preferred that a stage heater for heating/heat insulating the substrate is provided also at this resin providing section.

Further, in the mounting system according to the present invention, although it is possible to directly convey the substrate, a structure is preferred wherein a metal carrier, especially, a carrier with a relatively great thermal capacity, is provided for conveying the substrate while placing the substrate on the carrier, and the substrate can be conveyed at a condition of being mounted on this carrier. To this carrier, preferably a substrate pressing plate for preventing a bowing of the substrate, for example, a plate spring, is provided.

In such a mounting system according to the present invention, in the substrate loader section, a baked substrate is put into the oven together with the substrate magazine and heat insulated at a predetermined temperature. The substrate taken out from the oven is heated and heat insulated at the predetermined temperature, also in the substrate conveying portion from the substrate waiting stage to the chip mounting section, in the chip mounting section, and in the substrate conveying portion from the chip mounting section to the substrate unloader section, by providing stage heaters for heating/heat insulating the substrate in the respective operative areas, and a re-moisture absorption of the substrate can be prevented.

Further, in the case where the resin providing section (an underfill section) is provided, by providing a stage heater for heating/heat insulating the substrate also to this resin providing section, the substrate is heated and heat insulated at the predetermined temperature also in this section, and a re-moisture absorption of the substrate can be prevented. Furthermore, in the substrate unloader section, because the substrate mounted with the chip is placed into the oven together with the substrate magazine, the substrate is heat insulated at the predetermined temperature also at this section, and it also becomes possible to accelerate to make the underfill agent B-stage. Therefore, the substrate is heat insulated at the predetermined temperature over the substantially entire mounting process having a series of steps, moisture absorption can be suppressed or prevented, and occurrence of the bowing of the substrate ascribed to the moisture absorption and delamination of mounting interface and voids accompanied with the evaporation of the absorbed moisture can be prevented.

Further, by mounting the substrate on the metal carrier with a relatively great thermal capacity and conveying the substrate between respective operational sections, it is effectively prevented that the temperature of the substrate quickly reduces during being conveyed through the respective sections, thereby achieving a better heat insulation. Further, by providing the substrate pressing plate to the carrier for preventing the bowing of the substrate, the bowing of the substrate during conveying can be prevented efficiently. Furthermore, if the resin providing section is provided to the chip mounting section and a resin is provided at the chip mounting section before mounting the chip, because the resin is made B-stage at the time of chip mounting, a shift of mounting and a delamination of mounting interface at the time of conveying after the chip mounting can be prevented.

Effect According to the Invention

In the mounting system according to the present invention, the mounting can be carried out at a stable dimensional condition by preventing the moisture absorption of the substrate and always keeping the temperature of the substrate at a constant temperature. Further, defects due to delamination of mounting interface, etc. at the time of curing in the oven after performing underfill can be decreased. By employing the system for mounting the substrate on the carrier with a great thermal capacity and conveying the substrate by the carrier, a better heat insulation performance can be obtained.

Further, by pressing the substrate by the substrate pressing plate such as a plate spring attached to the carrier as well as preventing the bowing of the substrate by preventing moisture absorption, conveying at a further stable dimensional condition becomes possible, and the accuracy for mounting may be further improved.

EXPLANATION OF SYMBOLS

Figure 1:
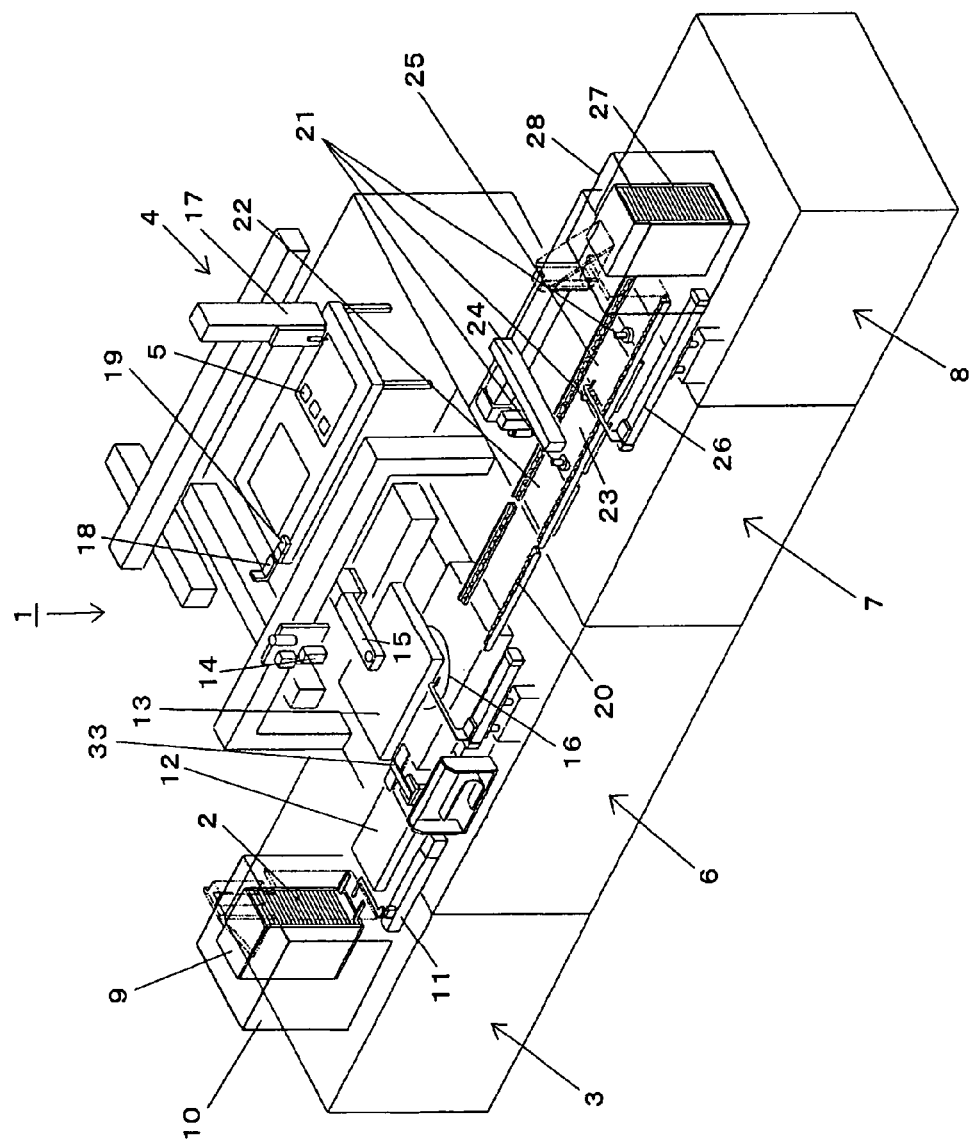
FIG. 1 is a perspective view of a mounting system according to an embodiment of the present invention.

1: mounting system
2: substrate
3: substrate loader section
4: chip loader section
5: chip
6: chip mounting section
7: resin providing section (underfill section)
8: substrate unloader section
9, 27: substrate magazine
10, 28: oven
11: substrate loader
12: waiting stage
13: stage with heater
14: bonding head
15: two-field camera
16: alignment device
17: chip taking-out device
18: chip slider
19: chip turning-over portion
20: conveying device
21: substrate stopper
22: pre-heating stage
23: underfill stage
24: resin providing device
25: post-heating stage
26: substrate unloader
29: carrier
30: hole
31: substrate holding portion
32: substrate pressing plate (plate spring)
33: transfer hand

THE BEST MODE FOR CARRYING OUT THE INVENTION

Hereinafter, desirable embodiments of the present invention will be explained referring to figures.

FIG. 1 shows a mounting system according to an embodiment of the present invention. In FIG. 1, symbol 1 shows the whole of a mounting system, and in this embodiment, mounting system 1 has a substrate loader section 3 for sequentially supplying substrates 2 to a chip mounting section 6, the chip mounting section 6 for mounting chips 5 sent from a chip loader section 4 onto substrates 2 supplied, a resin providing section (underfill section) 7 for providing a resin (underfill agent) between the substrate 2 and the chip 5 and curing the resin, and a substrate unloader section 8 for sequentially taking out the substrates 2, whereupon chips 5 are mounted, from the chip mounting section 6 (in this embodiment, from the underfill section 7).

In substrate loader section 3, an oven 10 is provided as a first oven capable of heat insulating substrate 2 together with a substrate magazine 9 capable of containing a plurality of substrates 2, and respective substrates 2 stocked in substrate magazine 9 are sustained at a predetermined constant temperature in oven 10. The respective substrates 2 stocked in substrate magazine 9 are supplied sequentially one by one to chip mounting section 6 by a substrate loader 11, and for this chip mounting section 6, a waiting stage 12 for substrate 2 is provided. In the substrate conveying portion from this waiting stage 12 to chip mounting section 6, a stage heater for heating/heat insulating a substrate is provided, and in this embodiment, the waiting stage 12 is structured as a pre-heating stage having a form in which a stage heater is embedded in the waiting stage 12.

A stage for fixing substrate 2 at a predetermined position for chip mounting is provided to chip mounting section 6, and this stage is structured as a stage with a heater 13 in which a stage heater is embedded for heating/heat insulating a substrate. In chip mounting section 6, chip 5 sent from chip loader section 4 is held on the lower surface of a bonding head 14, the position of chip 5 located at an upper portion and the position of substrate 2 located at a lower portion are read, for example, by a two-field camera 15, and the alignment in position between chip 5 and substrate 2 is carried out. In this embodiment, this alignment is carried out mainly by an alignment device 16 provided on the substrate side.

In chip loader section 4, chips 5 are sequentially taken out from the stock portion via a chip taking-out device 17, the chip 5 taken out by the chip taking-out device 17 is turned over at a chip turning-over portion 19 after being transferred to the chip turning-over portion 19, and the turned-over chip 5 is taken out by the chip taking-out device 17 and held by a chip slider 18. Chip 5 sent to chip mounting section 6 by the movement of chip slider 18 is held on the lower surface of the above-described bonding head 14.

From chip mounting section 6, substrate 2 mounted with chip 5 is sent to underfill section 7 via a conveying device 20. In underfill section 7, substrate 2 having been sent thereto is stopped at a predetermined position via a substrate stopper 21 in each stage. After substrate 2 is pre-heated at a pre-heating stage 22 in which a stage heater is embedded for heating/heat insulating a substrate, the substrate 2 is sent to an underfill stage 23 in which a stage heater is embedded similarly and provided with a resin (an underfill agent) between the substrate 2 and chip 5 by a resin providing device 24, and the resin is made B-stage at a post-heating stage 25 in which a stage heater is embedded similarly.

Substrates 2, in which the provided resin has been made to be B-stage at post-heating stage 25 and on which chips 5 have been mounted, are sequentially contained into a substrate magazine 27 at substrate unloader section 8 by a substrate unloader 26. In substrate unloader section 8, an oven 28 is provided as a second oven capable of heat insulating substrate 2 together with substrate magazine 27.

Figure 2:
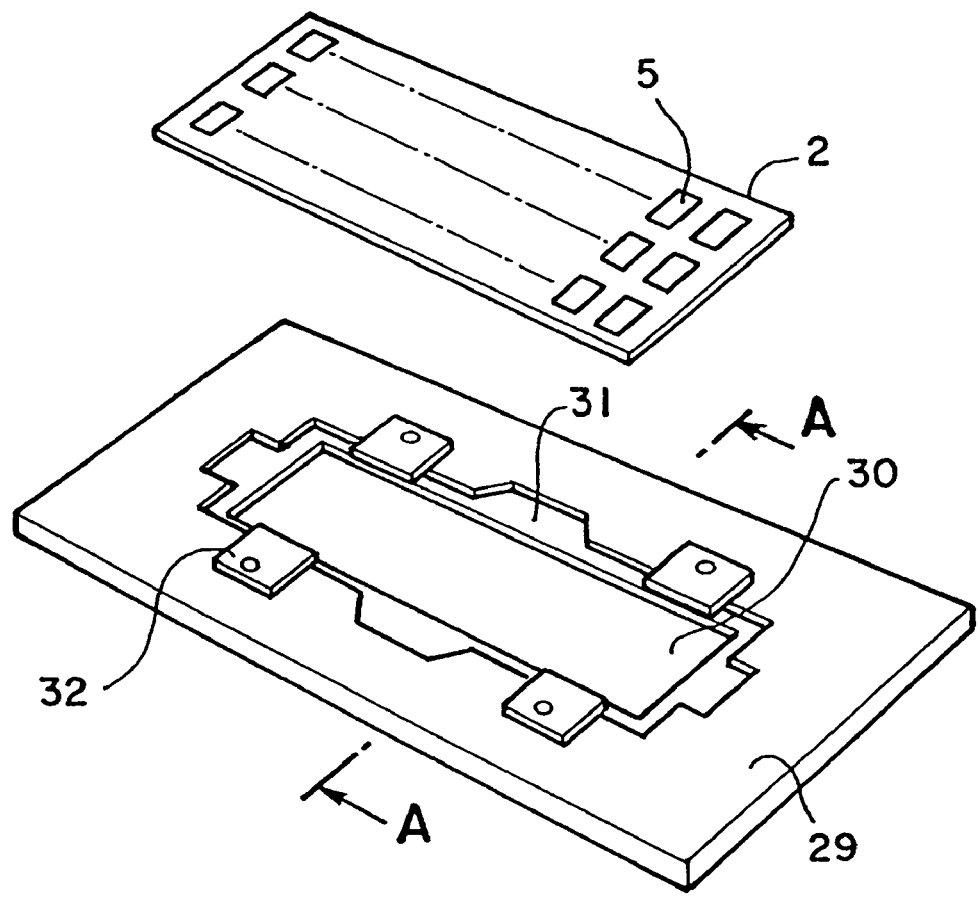
FIG. 2 is a perspective view of a carrier used in the system depicted in FIG. 1.
Figure 3:
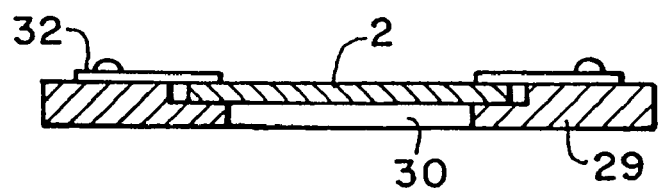
FIG. 3 is a vertical sectional view of the carrier depicted in FIG. 2 as viewed along A-A line of FIG. 2.

Although substrate 2 can be directly conveyed between the respective operational sections from substrate magazine 9 to substrate magazine 27, in the above-described mounting system 1 according to this embodiment, as shown in FIGS. 2 and 3, a metal carrier 29 having a relatively great thermal capacity is provided for mounting substrate 2 and conveying the substrate 2, and the substrate 2 is conveyed at a condition being placed on this carrier 29. A hole 30 is provided to carrier 29, and a substrate holding portion 31 is formed around this hole 30. Substrate pressing plates 32 are provided to carrier 29, and the mounted substrate 2 is fixed on carrier 29 at a predetermined position via the substrate pressing plates 32. In this embodiment, each substrate pressing plate 32 is formed from a plate spring, fixed onto carrier 29 by screw fastening, attraction by a magnet, adhesion by an adhesive sheet, etc., and formed as a detachable structure. The mounting of substrate 2 onto carrier 29 is carried out in advance before supply to substrate magazine 9 of mounting system 1, and the substrate 2 is conveyed at a condition being mounted on carrier 29 from substrate magazine 9 to substrate magazine 27.

In the mounting system 1 thus constructed, substrate 2 baked and dehumidified beforehand is contained in substrate magazine 9 at substrate loader section 3, and the substrate 2 is put into oven 10 together with the substrate magazine 9 and heat insulated at a predetermined temperature. Substrate 2 taken out from oven 10 is heated/heat insulated at a predetermined temperature in the respective operational areas from waiting stage 12 to substrate magazine 27 by the stage heaters provided for heating/heat insulating the substrate 2, and re-moisture absorption of the substrate 2 can be prevented. Further, in substrate unloader section 8, because substrate 2 mounted with the chip is contained in oven 28 together with substrate magazine 27, also in this section the substrate 2 is heat insulated at a predetermined temperature. Therefore, substrate 2 is sustained at a predetermined temperature over the entire mounting process having a series of steps, and moisture absorption can be suppressed or prevented. As a result, occurrence of the bowing of the substrate 2 ascribed to moisture absorption and delamination of mounting interface and voids accompanied with the evaporation of absorbed moisture can be prevented.

Further, because substrate 2 is mounted on metal carrier 29 having a relatively great thermal capacity and conveyed between the respective operational sections with such a condition, a quick reduction in temperature of the substrate 2 can be effectively suppressed, and the substrate 2 can be sustained at a good heat insulating condition.

Furthermore, by providing substrate pressing plates 32 (plate springs) to carrier 29 for preventing bowing of substrate 2, the bowing of the substrate 2 during conveying and the bowing of the substrate 2 in the respective operational sections can be efficiently prevented. Therefore, a high-accuracy mounting becomes possible.

In the present invention, various forms can be employed for the substrate or the chip. Namely, in the present invention, the substrate means a concept including all the members of the side mounted with a chip, regardless of its kind or its size, for example, such as a resin substrate, a glass substrate, a film substrate, a chip, or a wafer. Further, in the present invention, the chip means a concept including all the members of the side mounted to a substrate, regardless of its kind or its size, for example, such as an IC chip, a semiconductor chip, an optical element, a surface mounting member, or a wafer.

Further, the heating means of oven 10 or 28 is desirably structured as a furnace embedded with a heater. If a closed space can be formed in oven 10 or 28, an oven having a chamber structure into which dried hot air is sent from outside may be employed.

Further, with respect to transfer of substrate 2 between stages, there are a case of carrying out using a transfer hand 33 and a case of using a conveyor system (conveying device 20 in FIG. 1). For example, for transfer of substrate 2 from waiting stage 12 to stage with heater 13, transfer of substrate 2 from stage with heater 13 to underfill stage 23 (not shown), or transfer of substrate 2 from underfill stage 23 to post-heating stage 25 (not shown), by providing a transfer hand 33 incorporated with a heater, reduction in temperature of substrate 2 due to the conveying can be suppressed. Further, also by incorporating a heater into a lower part of conveying device 20, reduction in temperature of substrate 2 due to the conveying can be suppressed.

INDUSTRIAL APPLICATIONS OF THE INVENTION

The mounting system according to the present invention can be applied to any kind of mounting, and in particular, it is suitable for the mounting using a substrate having a problem ascribed to moisture absorption, for example, a resin-group substrate.

The invention claimed is:

1. A mounting system having a substrate loader section for sequentially supplying substrates to a chip mounting section, said chip mounting section for mounting chips onto substrates supplied, and a substrate unloader section for sequentially taking out substrates whereupon chips are mounted, characterized in that said substrate loader section is provided with a first oven capable of heat insulating a substrate together with a substrate magazine capable of containing a plurality of substrates, a stage heater for heating/heat insulating a substrate is provided, respectively, at a substrate conveying portion from a substrate waiting stage for said chip mounting section to said chip mounting section, at said chip mounting section, and at a substrate conveying portion from said chip mounting section to said substrate unloader section, and said substrate unloader section is provided with a second oven capable of heat insulating a substrate together with a substrate magazine capable of containing a plurality of substrates whereupon chips are mounted.

2. The mounting system according to claim 1, wherein a resin providing section for providing a resin between a substrate and a chip is provided between said chip mounting section and said substrate unloader section.

3. The mounting system according to claim 1, wherein a resin providing section for providing a resin between a substrate and a chip is provided at said chip mounting section.

4. The mounting system according to claim 2, wherein a stage heater for heating/heat insulating a substrate is provided also at said resin providing section.

5. The mounting system according to claim 1, wherein a metal carrier is provided for conveying a substrate while placing said substrate on said carrier.

6. The mounting system according to claim 5, wherein a substrate pressing plate for preventing a bowing of a substrate is provided to said carrier.

7. The mounting system according to claim 6, wherein said substrate pressing plate formed as a plate spring.

8. The mounting system according to claim 3, wherein a stage heater for heating/heat insulating a substrate is provided also at said resin providing section.

* * * * *